United States Patent
Lin

(10) Patent No.: US 9,082,631 B1
(45) Date of Patent: Jul. 14, 2015

(54) LINEAR EQUALIZER CIRCUIT AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 14/271,509

(22) Filed: May 7, 2014

(51) Int. Cl.
| | |
|---|---|
| *H01L 27/11* | (2006.01) |
| *H01L 27/06* | (2006.01) |
| *H03F 3/45* | (2006.01) |
| *H03F 3/195* | (2006.01) |
| *H03F 3/21* | (2006.01) |

(52) U.S. Cl.
CPC ........ *H01L 27/0629* (2013.01); *H01L 27/0611* (2013.01); *H03F 3/195* (2013.01); *H03F 3/211* (2013.01); *H03F 3/45179* (2013.01); *H03F 3/45192* (2013.01)

(58) Field of Classification Search
CPC ............ H01L 27/0629; H01L 27/0611; H03F 3/45179; H03F 3/45192; H03F 3/195; H03F 3/211
USPC ................... 257/379, 369, 328; 330/253, 261
See application file for complete search history.

(56) References Cited

U.S. PATENT DOCUMENTS

| | | | |
|---|---|---|---|
| 6,515,547 B2 * | 2/2003 | Sowlati .......................... | 330/311 |
| 8,493,092 B2 * | 7/2013 | Rajaee et al. .................... | 326/86 |

* cited by examiner

*Primary Examiner* — Tu-Tu Ho
(74) *Attorney, Agent, or Firm* — McClure, Qualey & Rodack, LLP

(57) ABSTRACT

A circuit having a first MOS transistor of a first type configured in a common-source amplifier topology for receiving an input signal and outputting an intermediate signal, a first MOS transistor of a second type configured in a self-biased topology biased via a first self-biasing RC network for providing termination for the intermediate signal, a second MOS transistor of the second type configured in a common-source amplifier topology for receiving the intermediate signal and outputting an output signal, and a second of MOS transistor of the first type configured in a self-biased topology via a second self-biasing RC network for providing termination to the output signal.

10 Claims, 4 Drawing Sheets

US 9,082,631 B1

LINEAR EQUALIZER CIRCUIT AND METHOD THEREOF

BACKGROUND OF THE INVENTION

1. Field of the Invention

The present invention generally relates to circuits and more particularly to linear equalizer circuits.

2. Description of Related Art

Persons of ordinary skill in the art will understand the terms used in this disclosure, such as MOS (metal-oxide semiconductor) transistor, including NMOS (n-channel metal-oxide semiconductor) transistor and PMOS (p-channel metal-oxide semiconductor), "gate," "source," "drain," "saturation region," as used in connection with a MOS transistor, and basic concepts for electronic circuits, such as: "voltage," "current," "trans-conductance," "source degeneration," "slew rate," "self-biasing," "differential," "pseudo-differential," "single-ended," "common-source," "impedance," "gain," "frequency response," "zero," "pole," and "Bode plot." Terms and basic concepts like these are apparent from prior art documents, e.g. text book such as "Design of Analog CMOS Integrated Circuits" by Behzad Razavi, McGraw-Hill (ISBN 0-07-118839-8), and thus will not be expressly defined or explained in detail herein.

A linear equalizer is an apparatus for amplifying an input signal to generate an output signal with a gain factor that is deliberately frequency dependent, so as to accommodate a dispersive property of the input signal. A linear equalizer of particular interest is one that provides a higher gain for a higher frequency component of the input signal than a lower frequency component of the input signal. As depicted in FIG. 1, a conventional prior art linear equalizer 100 comprises: a differential pair 120 comprising NMOS (which stands for n-channel metal oxide semiconductor transistor) transistors 121 and 122 configured in a common-source amplifier configuration for amplifying a differential input signal VI (which comprises two ends VI+ and VI−) into a differential output signal VO (which comprises two ends VO+ and VO− •); a load 110 comprising resistors 111 and 112 for providing termination for the differential output signal VO; a biasing network 140 comprising current sources 141 and 142 for providing biasing currents I1 and I2 for the differential pair 120; and a RC-degeneration network 130 comprising a resistor 131 and a capacitor 132 for providing source degeneration to the differential pair 120. Throughout this disclosure, VDD denotes a power supply node, and VSS denotes a ground node. As known to those of ordinary skill in the art, source degeneration of a common-source MOS amplifier reduces a gain of the common-source MOS amplifier, and greater impedance of the source degeneration network leads to greater gain reduction. Here, impedance of the RC-degeneration network 130 is frequency dependent and decreases as frequency increases; a lower frequency component of the input signal VI encounters lower impedance of RC-degeneration and thus less gain reduction, compared with a higher frequency component of the input signal VI; therefore, a higher gain is provided for the higher frequency component of the input signal VI than the lower frequency component of the input signal VI.

Although linear equalizer 100 fulfills the purpose of equalization by providing a higher gain for a higher frequency component of the input signal than for a lower frequency component of the input signal, the equalization is fulfilled by enforcing "more gain reduction" on the lower frequency component instead of "more gain enhancement" on the higher frequency component of the input signal. As a result, a higher degree of equalization requires a higher degree of gain reduction for the lower frequency component. Due to the gain reduction, a subsequent wide-band amplifier, which provides approximately the same gain to both the lower frequency component and the higher frequency component, is often needed to compensate for the gain reduction due to the RC-degeneration.

BRIEF SUMMARY OF THE INVENTION

An objective of this present invention is to equalize an input signal by providing a gain enhancement for a high frequency component of the input signal, wherein a higher degree of equalization is fulfilled by providing a higher degree of gain enhancement for the high frequency component of the input signal.

In one embodiment, a circuit comprises: a first MOS transistor of a first type configured in a common-source amplifier topology for receiving an input signal and outputting an intermediate signal; a first MOS transistor of a second type configured in a self-biased topology biased via a first self-biasing RC network for providing termination for the intermediate signal; a second MOS transistor of the second type configured in a common-source amplifier topology for receiving the intermediate signal and outputting an output signal; and a second of MOS transistor of the first type configured in a self-biased topology via a second self-biasing RC network for providing termination to the output signal. In one embodiment, a self-biasing RC network for a MOS transistor, either of the first type or the second type, comprises a resistor and a capacitor, wherein a drain terminal of the MOS transistor is coupled to a gate terminal of the MOS transistor via the resistor, and the gate terminal of the MOS transistor is coupled to either a power supply node or a ground node via the capacitor. In one embodiment, a PMOS transistor is referred to as a MOS transistor of the first type, and a NMOS transistor is referred to as a MOS transistor of the second type. In another embodiment, a NMOS transistor is referred to as a MOS transistor of the first type, and a PMOS transistor is referred to as a MOS transistor of the second type. In this regard, NMOS and PMOS refer to types of transistors.

In one embodiment, a method comprises: receiving an input signal; amplifying the input signal using a first MOS transistor of a first type configured in a common-source amplifier topology to generate an intermediate signal; providing termination to the intermediate signal using a first MOS transistor of a second type configured in a self-biased topology via a first self-biasing RC network; amplifying the intermediate signal using a second MOS transistor of the second type configured in a common-source amplifier topology to generate an output signal; and providing termination to the output signal using a second MOS transistor of the first type configured in a self-biased topology via a second self-biasing RC network. In one embodiment, a self-biasing RC network for a MOS transistor, either of the first type or the second type, comprises a resistor and a capacitor, wherein a drain terminal of the MOS transistor is coupled to a gate terminal of the MOS transistor via the resistor, and the gate terminal of the MOS transistor is coupled to either a power supply node or a ground node via the capacitor. Again, in one embodiment, a PMOS transistor is referred to as a MOS transistor of the first type, and a NMOS transistor is referred to as a MOS transistor of the second type. In another embodiment, a NMOS transistor is referred to as a MOS transistor of the first type, and a PMOS transistor is referred to as a MOS transistor of the second type.

DETAILED DESCRIPTION OF THIS INVENTION

The present invention relates to linear equalizer. While the specifications described several example embodiments of the invention considered best modes of practicing the invention, it should be understood that the invention can be implemented in many ways and is not limited to the particular examples described below or to the particular manners in which any features of such examples are implemented. In other instances, well-known details are not shown or described to avoid obscuring aspects of the invention.

Figure 1:
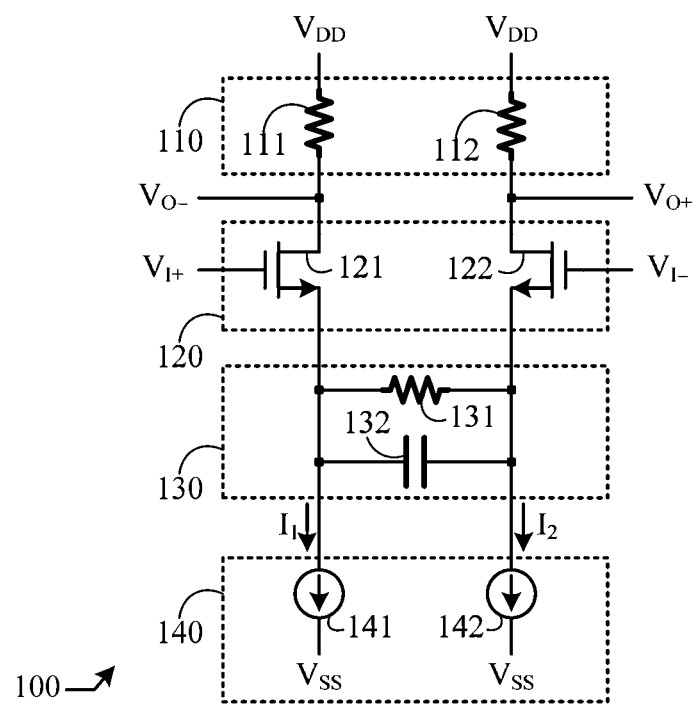
FIG. 1 shows a schematic diagram of a prior art linear equalizer.
Figure 2:
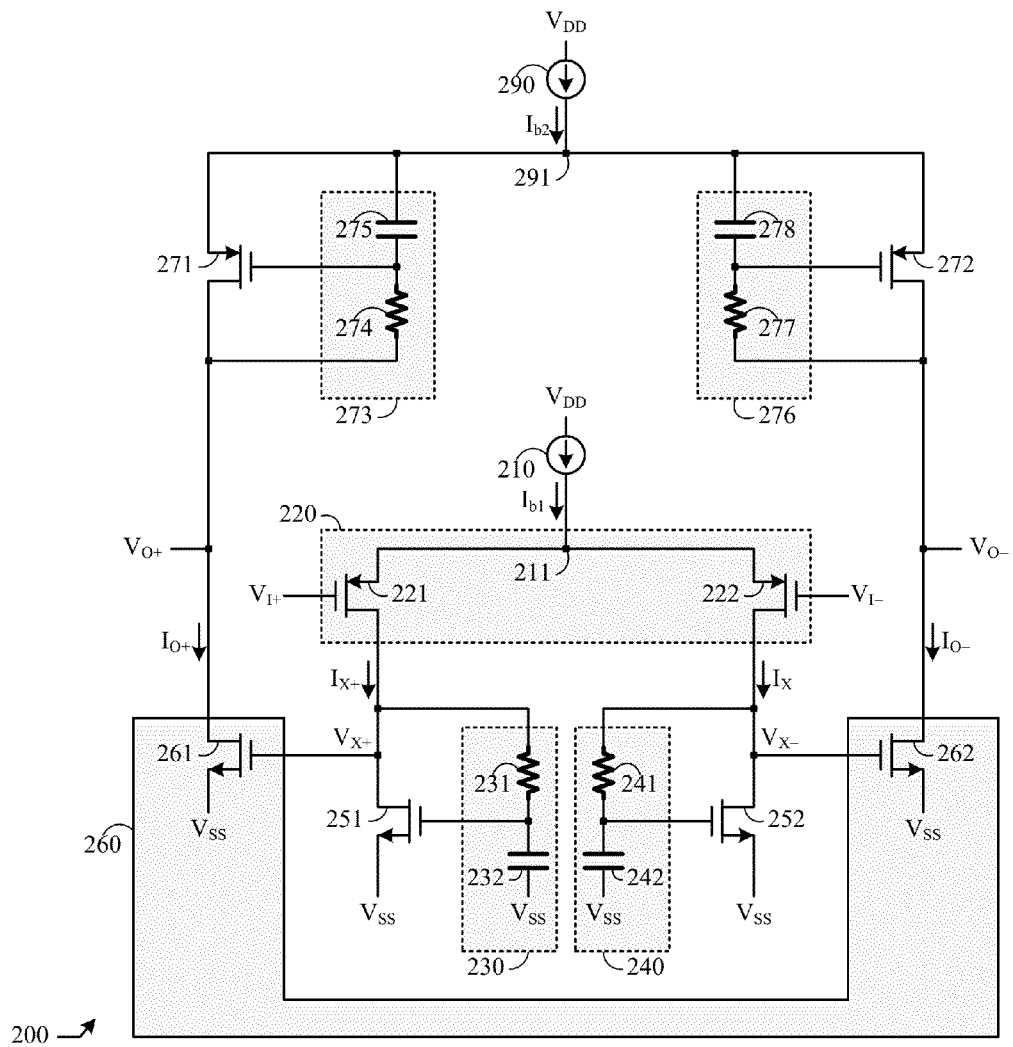
FIG. 2 shows a schematic diagram of a linear equalizer in accordance with an embodiment of the present invention.

As depicted in FIG. 2, a linear equalizer 200 in accordance with an embodiment of the present invention comprises: a first current source 210 for providing a first biasing current Ib1; a differential pair 220 comprising PMOS (which stands for p-channel metal oxide semiconductor transistor) 221 and 222 for receiving the first biasing currents Ib1 and amplifying a voltage-mode input signal VI (which is a differential signal comprising two ends VI+ and VI−) into a current-mode intermediate signal IX (which is a differential signal comprising two ends IX+ and IX−); a first pair of self-biased NMOS loads comprising NMOS 251 and 252 for providing a termination for the current-mode intermediate signal IX and thus establishing a voltage-mode intermediate signal VX (which is a differential signal comprising two ends VX+ and VX−); a pseudo-differential pair 260 comprising NMOS 261 and 262 for receiving the voltage-mode intermediate signal VX and outputting current-mode output signal IO (which is a differential signal comprising two ends IO+ and IO−); a second pair of self-biased PMOS loads comprising source-coupled PMOS 271 and 272 for providing a termination for the current-mode output signal IO and thus establishing a voltage-mode output signal VO; and a second current source 290 for providing a second biasing current Ib2 for the source-coupled PMOS 271 and 272. NMOS 251 is self-biased via a self-biasing RC-network 230 comprising a resistor 231 and a capacitor 232. NMOS 252 is self-biased via a self-biasing RC-network 240 comprising a resistor 241 and a capacitor 242. PMOS 271 is self-biased via a self-biasing RC-network 273 comprising a resistor 274 and a capacitor 275. PMOS 272 is self-biased via a self-biasing RC-network 276 comprising a resistor 277 and a capacitor 278. Self-biasing RC-networks 230, 240, 273, and 276 are used along with their respective MOS loads 251, 252, 271, and 272 to provide a higher impedance for a higher frequency signal than a lower frequency signal. Due to the higher impedance for a higher frequency signal, linear equalizer 200 provides a higher gain for a higher frequency signal, fulfilling an equalization function. That is, if there are a second input signal with a second frequency and a first input signal with a first frequency higher than the second frequency, the linear equalizer 200 can output a second output signal from the second input signal with a second gain and a first output signal from the first input signal with a first gain higher than the second gain because RC-networks 230, 240, 273, and 276 along with their respective MOS loads 251, 252, 271, and 272 provide t a higher first impedance for the first signal than a second impedance for the second output. Certain principles of linear equalizer 200 are explained below.

Figure 3:
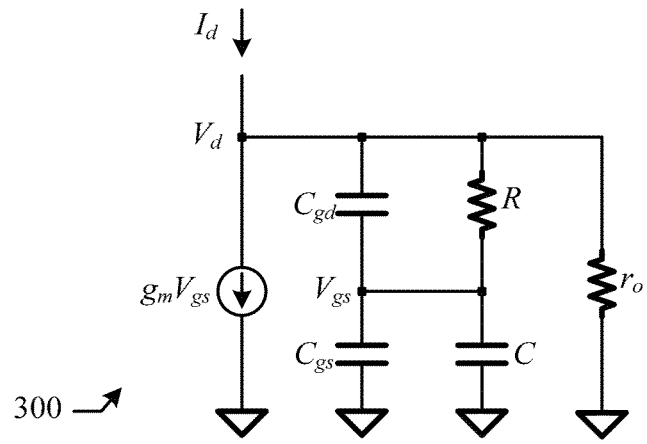
FIG. 3 shows a schematic diagram of a small-signal equivalent circuit model for a self-biased MOS transistor with a self-biasing RC-network.

A small-signal equivalent circuit model 300 for a self-biased MOS transistor with self-biasing RC-network is shown in FIG. 3. Here, using the self-biased NMOS 251 with self-biasing RC-network 230 as an example, Vgs is the gate-to-source voltage of NMOS 251; gm is the transconductance of NMOS 251; ro is the output resistance of NMOS 251; Cgs is the gate-to-source capacitance of NMOS 251; Cgd is the gate-to-drain capacitance of NMOS 251; R is the resistance of the resistor 231 of the self-biasing RC-network 230; C is the capacitance of the capacitor 232 of the self-biasing RC-network 230; Id is the total current flowing into the self-biased NMOS 251 and the RC-network 230; and Vd is the voltage at the drain of NMOS 251. In practice, the output resistance ro is much greater than the reciprocal of the transconductance gm and is thus negligible. By neglecting ro, it can be shown that the impedance Z looking into the self-biased NMOS 251 and the RC-network 230 is:

$$Z \equiv \frac{V_d}{I_d} = \frac{1 + sR(C + C_{gs} + C_{gd})}{g_m(1 + sRC_{gd})(1 + 2(C + C_{gs})/g_m)}, \quad (1)$$

which has a one-zero two-pole frequency response comprising a zero at $$\omega_z = 1/R(C + C_{gs} + C_{gd}), \quad (2)$$

a first pole at $$\omega_{p1} = 1/RC_{gd}, \quad (3)$$

and a second pole at $$\omega_{p2} = g_m/(C + C_{gs}). \quad (4)$$

Figure 4:
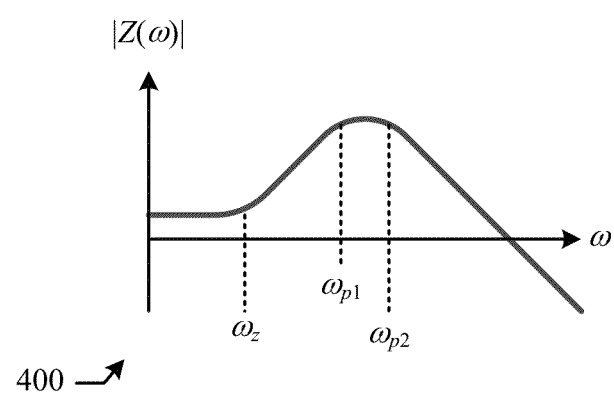
FIG. 4 shows a Bode plot of a frequency response of the self-biased MOS transistor with self-biasing RC-network.

Note that zero $\omega_z$ will always be smaller than the first pole $\omega_{p1}$. As long as $g_m R > 1$, the first pole $\omega_{p1}$ will be smaller than the second pole $\omega_{p2}$. As depicted in a Bode-plot 400 shown in FIG. 4, for frequency $\omega$ between the zero $\omega_z$ and the first pole $\omega_{p1}$, the magnitude of the impedance Z increases as the frequency $\omega$ increases. Since a gain of an amplifier terminated with a load is proportional to the impedance of the load, linear equalizer 200 provides a higher gain for a higher frequency signal, provided the frequency $\omega$ lies between the zero $\omega_z$ and the first pole $\omega_{p1}$. This allows the linear equalizer 200 to fulfill the equalization function.

Linear equalizer 200 is advantageous to linear equalizer 100 in that: the equalization is fulfilled by enforcing "more gain enhancement" on the higher frequency signal, instead of "more gain reduction" on the lower frequency signal; a high degree of equalization can be accomplished without sacrificing the gain of the low frequency signal, thus eliminating the need to use a subsequent wide-band amplifier.

Although linear equalizer 200 of FIG. 2 is based on using PMOS devices for differential pair 220, it is known that, for a given circuit comprising a plurality of MOS devices along with passive devices such as resistors and capacitors, swapping the roles of PMOS and NMOS (i.e., replacing every NMOS in the given circuit with a PMOS, and replacing every PMOS in the given circuit with a NMOS), and also swapping the roles of the supply voltage and the ground (i.e., changing every VDD in the given circuit to VSS, and changing every VSS in the given circuit to VDD) may result in a "flipped" circuit that has the same function as the originally given circuit.

Although linear equalizer 200 is based on a differential circuit topology, it should be understood that the same principles can be applied to pseudo-differential circuit topology, and also can be applied to single-ended circuit topology. In an embodiment not shown in the figure but should be clear to persons of ordinary skill in the art, current sources 210 and 290 are removed and circuit nodes 211 and 291 are directly coupled to the power supply node VDD; this results in an embodiment of the present invention in a pseudo-differential circuit topology comprising two halves, wherein VI+ and VI− are uncoupled and processed separately to generate VO+ and VO− using the two halves, respectively. In a further embodiment not shown in the figure but which should be clearly understood by persons of ordinary skill in the art, one of the just mentioned two halves is removed. This results in an embodiment of the present invention in a single-ended circuit topology.

Figure 5:
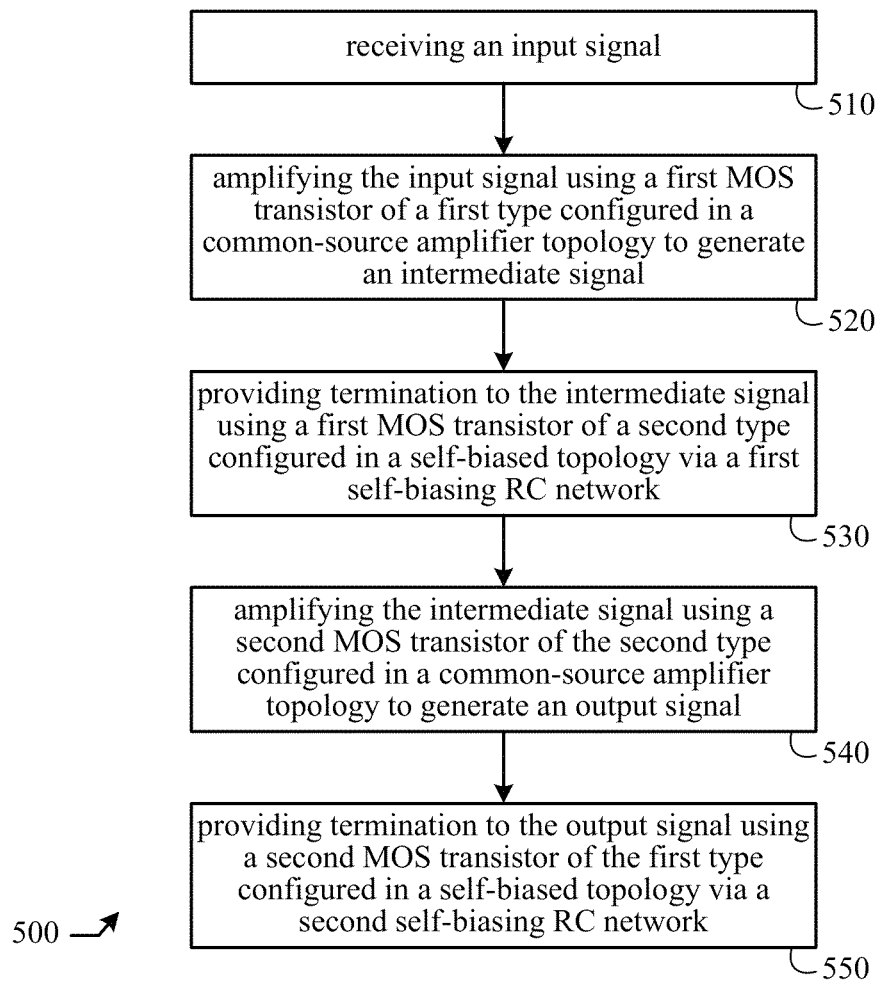
FIG. 5 shows a flow diagram of a method in accordance with an embodiment of this present invention.

In an embodiment illustrated by a flow diagram 500 shown in FIG. 5, a method comprises: step 510 for receiving an input signal; step 520 for amplifying the input signal using a first MOS transistor of a first type configured in a common-source amplifier topology to generate an intermediate signal; step 530 for providing termination to the intermediate signal using a first MOS transistor of a second type configured in a self-biased topology via a first self-biasing RC network; step 540 for amplifying the intermediate signal using a second MOS transistor of the second type configured in a common-source amplifier topology to generate an output signal; and step 550 for providing termination to the output signal using a second MOS transistor of the first type configured in a self-biased topology via a second self-biasing RC network.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit comprising:
   a first MOS (Metal Oxide Semiconductor) transistor of a first type configured in a common-source amplifier topology for receiving an input signal and outputting an intermediate signal;
   a first MOS transistor of a second type configured in a self-biased topology biased via a first self-biasing RC network for providing termination for the intermediate signal;
   a second MOS transistor of the second type configured in a common-source amplifier topology for receiving the intermediate signal and outputting an output signal; and
   a second MOS transistor of the first type configured in a self-biased topology via a second self-biasing RC network for providing termination to the output signal.

2. The circuit of claim 1, wherein the first self-biasing RC network comprises: a resistor coupling a drain terminal to a gate terminal of the first MOS transistor of the second type, and a capacitor coupling the gate terminal of the first MOS transistor of the second type to either a power supply node or a ground node.

3. The circuit of claim 1, wherein the second self-biasing RC network comprises: a resistor coupling a drain terminal to a gate terminal of the second MOS transistor of the first type, and a capacitor coupling the gate terminal of the second MOS transistor of the first type to either a power supply node or a ground node.

4. The circuit of claim 1, wherein the MOS transistor of the first type is a PMOS (p-type MOS) transistor, and the MOS transistor of the second type is an NMOS (n-type MOS) transistor.

5. The circuit of claim 1, wherein the MOS transistor of the first type is an NMOS (n-type MOS) transistor, and the MOS transistor of the second type is a PMOS (p-type MOS) transistor.

6. A method comprising:
   receiving an input signal;
   amplifying the input signal using a first MOS (Metal Oxide Semiconductor) transistor of a first type configured in a common-source amplifier topology to generate an intermediate signal;
   providing termination to the intermediate signal using a first MOS transistor of a second type configured in a self-biased topology via a first self-biasing RC (resistor-capacitor) network;
   amplifying the intermediate signal using a second MOS transistor of the second type configured in a common-source amplifier topology to generate an output signal; and
   providing termination to the output signal using a second MOS transistor of the first type configured in a self-biased topology via a second self-biasing RC network.

7. The method of claim 6, wherein the first self-biasing RC network comprises: a resistor coupling a drain terminal to a gate terminal of the first MOS transistor of the second type, and a capacitor coupling the gate terminal of the first MOS transistor of the second type to either a power supply node or a ground node.

8. The method of claim 6, wherein the second self-biasing RC network comprises: a resistor coupling a drain terminal to a gate terminal of the second MOS transistor of the first type, and a capacitor coupling the gate terminal of the second MOS transistor of the first type to either a power supply node or a ground node.

9. The method of claim 6, wherein the MOS transistor of the first type is a PMOS (p-type MOS), and the MOS transistor of the second type is an NMOS (n-type MOS) transistor.

10. The method of claim 6, wherein the MOS transistor of the first type is an NMOS (n-type MOS) transistor, and the MOS transistor of the second type is a PMOS (p-type MOS) transistor.

* * * * *